(12) United States Patent
Yu et al.

(10) Patent No.: US 10,378,105 B2
(45) Date of Patent: Aug. 13, 2019

(54) SELECTIVE DEPOSITION WITH SURFACE TREATMENT

(71) Applicant: Tokyo Electron Limited, Minato-ku, Tokyo (JP)

(72) Inventors: Kai-Hung Yu, Watervliet, NY (US); Kandabara N. Tapily, Mechanicville, NY (US); Takahiro Hakamata, Albany, NY (US); Subhadeep Kal, Albany, NY (US); Gerrit J. Leusink, Rexford, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/610,165

(22) Filed: May 31, 2017

(65) Prior Publication Data

US 2017/0342553 A1 Nov. 30, 2017

Related U.S. Application Data

(60) Provisional application No. 62/343,753, filed on May 31, 2016.

(51) Int. Cl.
*H01L 21/02* (2006.01)
*H01L 21/31* (2006.01)
(Continued)

(52) U.S. Cl.
CPC .............. *C23C 16/40* (2013.01); *B01D 53/76* (2013.01); *C23C 16/04* (2013.01); *C23C 16/401* (2013.01);
(Continued)

(58) Field of Classification Search
CPC ......... H01L 27/10855; H01L 27/10882; H01L 27/10885; H01L 27/10888;
(Continued)

(56) References Cited

U.S. PATENT DOCUMENTS 8,242,019 B2    8/2012  Ishizaka et al.
2004/0051174 A1* 3/2004  Steinecke ........... H01L 23/5222
                                                    257/739
(Continued)

FOREIGN PATENT DOCUMENTS

JP      2013527012 A    6/2013
KR   10-2013-0065647 A   6/2013

OTHER PUBLICATIONS

Japan Patent Office, Notice of Reasons for Rejection for Japanese patent application No. 2017-107853, dated Feb. 6, 2018, 8pp.
(Continued)

*Primary Examiner* — Nduka E Ojeh

(57) ABSTRACT

Embodiments of the invention provide methods for selective deposition on different materials using a surface treatment. According to one embodiment, the method includes providing a substrate containing a first material layer having a first surface and a second material layer having a second surface, and performing a chemical oxide removal process that terminates that second surface with hydroxyl groups. The method further includes modifying the second surface by exposure to a process gas containing a hydrophobic functional group, the modifying substituting the hydroxyl groups on the second surface with the hydrophobic functional group, and selectively depositing a metal-containing layer on the first surface but not on the modified second surface by exposing the substrate to a deposition gas.

5 Claims, 7 Drawing Sheets

(51) Int. Cl.
*H01L 21/60* (2006.01)
*H01L 21/205* (2006.01)
*H01L 21/285* (2006.01)
*H01L 21/768* (2006.01)
*H01L 21/3105* (2006.01)
*C23C 16/40* (2006.01)
*B01D 53/76* (2006.01)
*C23C 16/455* (2006.01)
*C23C 16/04* (2006.01)

(52) U.S. Cl.
CPC ...... *C23C 16/455* (2013.01); *C23C 16/45563* (2013.01); *H01L 21/02057* (2013.01); *H01L 21/205* (2013.01); *H01L 21/28562* (2013.01); *H01L 21/31* (2013.01); *H01L 21/3105* (2013.01); *H01L 21/31053* (2013.01); *H01L 21/76826* (2013.01); *H01L 21/76849* (2013.01); *B01D 2251/202* (2013.01); *H01L 2021/60052* (2013.01)

(58) Field of Classification Search
CPC .......... H01L 27/10891; H01L 27/1085; H01L 21/641; H01L 21/28562; H01L 21/31053; H01L 21/31; H01L 21/205; C23C 16/40; C23C 16/401; C23C 16/455; C23C 16/45563; B01D 53/76
USPC ..... 257/E21.171, E21.44, E21.586; 438/785, 438/256, 399, 641, 674
See application file for complete search history.

(56) References Cited

U.S. PATENT DOCUMENTS

| 2009/0197405 | A1* | 8/2009 | Besling | H01L 21/28562 438/653 |
| 2010/0015798 | A1* | 1/2010 | Suzuki | C23C 16/02 438/653 |
| 2010/0240218 | A1* | 9/2010 | Ugajin | H01L 21/02063 438/706 |
| 2010/0248473 | A1* | 9/2010 | Ishizaka | H01L 21/02063 438/659 |
| 2011/0244680 | A1* | 10/2011 | Tohnoe | H01L 21/02074 438/677 |

OTHER PUBLICATIONS

Korean Intellectual Property Office, Office Action for korean patent application 10-2017-0067619, dated Sep. 5, 2018, 17pp.
Japan Patent Office, Notice of Reasons for Rejection for japanese patent application No. 2017-107853, dated Nov. 20, 2018, 11pp.
Japan Patent Office, Office Action for Japanese patent application No. 2017-107853, dated Mar. 26, 2019, 4pp.

* cited by examiner

SiO_x

SELECTIVE DEPOSITION WITH SURFACE TREATMENT

CROSS-REFERENCE TO RELATED APPLICATIONS

This application is related to and claims priority to U.S. Provisional Patent Application Ser. No. 62/343,753 filed on May 31, 2016, the entire contents of which are herein incorporated by reference.

FIELD OF THE INVENTION

The present invention relates to semiconductor processing and semiconductor devices, and more particularly, to methods for selective deposition on different materials using a surface treatment.

BACKGROUND OF THE INVENTION

As device size is getting smaller at the 14 nm technology node, the complexity in manufacturing is increasing. The cost to produce the semiconductor devices is also increasing and cost effective solutions and innovations are needed. As smaller transistors are manufactured, the critical dimension (CD) or resolution of patterned features is becoming more challenging to produce. Self-aligned patterning may replace overlay-driven patterning so that cost-effective scaling can continue even after EUV introduction. Patterning options that enable reduced variability, extend scaling and enhanced CD and process control are needed. Selective deposition of thin films is a key step in patterning in highly scaled technology nodes. New deposition methods are required that provide selective film deposition on different material surfaces. The new methods that are needed include selective deposition of dielectric materials on dielectric materials (DoD), dielectric materials on metals (DoM), metals on metals (MoM), metals on dielectric materials (MoD), and metals on silicon (MOS).

SUMMARY OF THE INVENTION

Embodiments of the invention provide methods for selective deposition on different materials using a surface treatment and a subsequent deposition process.

According to one embodiment of the invention, the method includes providing a substrate containing a first material layer having a first surface and a second material layer having a second surface, and performing a chemical oxide removal process that terminates that second surface with hydroxyl groups. The method further includes modifying the second surface by exposure to a process gas containing a hydrophobic functional group, the modifying substituting the hydroxyl groups on the second surface with the hydrophobic functional group, and selectively depositing a metal-containing layer on the first surface but not on the modified second surface by exposing the substrate to a deposition gas.

BRIEF DESCRIPTION OF THE DRAWINGS

A more complete appreciation of embodiments of the invention and many of the attendant advantages thereof will become readily apparent with reference to the following detailed description, particularly when considered in conjunction with the accompanying drawings, in which.

DETAILED DESCRIPTION OF SEVERAL EMBODIMENTS

Embodiments of the invention provide methods for selective deposition on different materials using a surface treatment and a subsequent deposition process. Selective deposition may be achieved by surface treatment that results in increased incubation times on surfaces of materials where deposition is not desired, while providing fast and effective deposition on other materials. This improved deposition selectivity provides a greater margin for line-to-line breakdown and electrical leakage performance in the semiconductor device containing the material layer. Embodiments of the invention greatly benefit surface sensitive gas phase deposition processes such as atomic layer deposition (ALD) and chemical vapor deposition (CVD), and variants thereof, as well as spin-on deposition.

According to one embodiment of the invention, the method includes providing a substrate containing a first material layer having a first surface and a second material layer having a second surface, and performing a chemical oxide removal (COR) process that terminates that second surface with hydroxyl groups. The method further includes modifying the second surface by exposure to a process gas containing a hydrophobic functional group, the modifying substituting the hydroxyl groups on the second surface with the hydrophobic functional group, and selectively depositing a metal-containing layer on the first surface but not on the modified second surface by exposing the substrate to a deposition gas. The COR process can include a dry etching process or a wet etching process. The dry etching process can, for example, be HF-based. The inventors have discovered that the COR process greatly enhances the subsequent surface modification of surfaces of dielectric materials, resulting in excellent blocking of subsequent deposition on the modified dielectric surfaces. In some examples, the modifying can include processes such as low-k restoration (LKR) or formation of self-assembled monolayers (SAM) on the substrate.

Figure 1A:
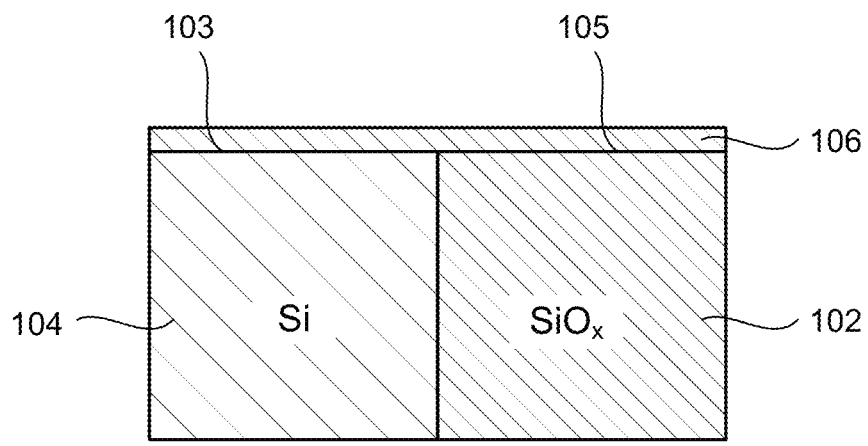
FIGS. 1A-1D show schematic cross-sectional views of a method for processing a substrate according to an embodiment of the invention.

FIGS. 1A-1D show schematic cross-sectional views of processing a substrate according to an embodiment of the invention. FIG. 1A shows a substrate containing a Si layer 104 having a first surface 103 and a SiOx layer 102 having a second surface 105. The SiOx layer 102 refers to oxidized Si where x is equal to or less than 2. SiO2 is the most thermodynamically stable of the silicon oxides and hence the most commercially important of the silicon oxides.

The substrate further contains a native oxide layer 106 on the Si layer 104 and on the $SiO_x$ layer 102. The native oxide layer 106 may form by atmospheric exposure that oxidizes the substrate. Alternatively, the native oxide layer 106 may include a chemical oxide layer that is deposited on the substrate. According to other embodiments, the $SiO_x$ layer 102 may further include or be replaced by one or more of SiN, SiOH, SiCOH, a high-k material, and a low-k material.

Interconnect delay is a major limiting factor in the drive to improve the speed and performance of integrated circuits (ICs). One way to minimize interconnect delay is to reduce interconnect capacitance by using low-k materials during production of the ICs. Such low-k materials have also proven useful for low temperature processing. Thus, in recent years, low-k materials have been developed to replace relatively high dielectric constant insulating materials, such as $SiO_2$ (k~4).

In particular, low-k films are being utilized for inter-level and intra-level dielectric layers between metal layers of semiconductor devices. Additionally, in order to further reduce the dielectric constant of insulating materials, material films are formed with pores, i.e., porous low-k materials. Such low-k materials can be deposited by a spin-on dielectric (SOD) method similar to the application of photo-resist, or by CVD.

Low-k materials may have a dielectric constant of less than 3.7, or a dielectric constant ranging from 1.6 to 3.7. Low-k materials can include fluorinated silicon glass (FSG), carbon doped oxide, a polymer, a SiCOH-containing low-k material, a non-porous low-k material, a porous low-k material, a spin-on dielectric (SOD) low-k material, or any other suitable dielectric material. The low-k material can include BLACK DIAMOND® (BD) or BLACK DIAMOND® II (BDII) SiCOH material, commercially available from Applied Materials, Inc., or Coral® CVD films commercially available from Novellus Systems, Inc. Other commercially available carbon-containing materials include SILK® (e.g., SiLK-I, SiLK-J, SiLK-H, SiLK-D, and porous SiLK semiconductor dielectric resins) and CYCLOTENE® (benzocyclobutene) available from Dow Chemical, and GX-3TM, and GX-3PTM semiconductor dielectric resins available from Honeywell.

Low-k materials include porous inorganic-organic hybrid films comprised of a single-phase, such as a silicon oxide-based matrix having $CH_3$ bonds that hinder full densification of the film during a curing or deposition process to create small voids (or pores). Still alternatively, these dielectric materials may include porous inorganic-organic hybrid films comprised of at least two phases, such as a carbon-doped silicon oxide-based matrix having pores of organic material (e.g., porogen) that is decomposed and evaporated during a curing process.

In addition, low-k materials include silicate-based materials, such as hydrogen silsesquioxane (HSQ) or methyl silsesquioxane (MSQ), deposited using SOD techniques. Examples of such films include FOOD HSQ commercially available from Dow Corning, XLK porous HSQ commercially available from Dow Corning, and JSR LKD-5109 commercially available from JSR Microelectronics.

High-k materials can contain one or more metal elements selected from alkaline earth elements, rare earth elements, Group IIIA, Group IVA, and Group IVB elements of the Periodic Table of the Elements. Alkaline earth metal elements include beryllium (Be), magnesium (Mg), calcium (Ca), strontium (Sr), and barium (Ba). Exemplary oxides include magnesium oxide, calcium oxide, and barium oxide, and combinations thereof. Rare earth metal elements may be selected from the group of scandium (Sc), yttrium (Y), lutetium (Lu), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), and ytterbium (Yb). The Group IVB elements include titanium (Ti), hafnium (Hf), and zirconium (Zr). According to some embodiments of the invention, the high-k material may contain $HfO_2$, HfON, HfSiON, $ZrO_2$, ZrON, ZrSiON, $TiO_2$, TiON, $Al_2O_3$, $La_2O_3$, $W_2O_3$, $CeO_2$, $Y_2O_3$, or $Ta_2O_5$, or a combination of two or more thereof. However, other dielectric materials are contemplated and may be used.

Figure 1B:
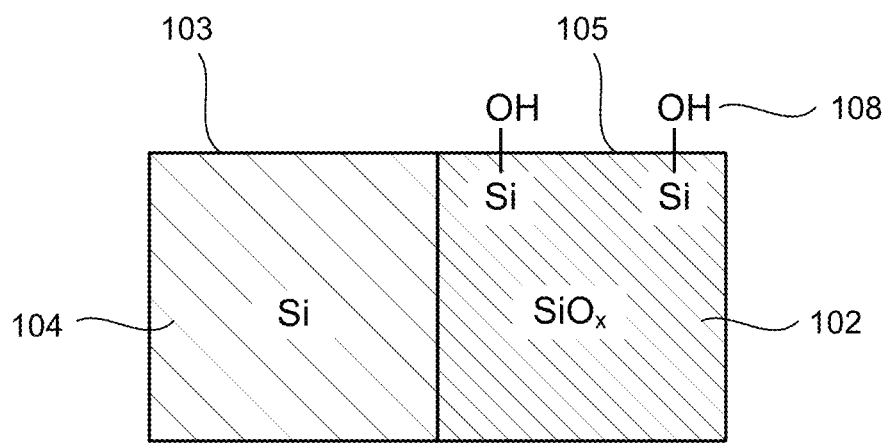

FIG. 1B shows the substrate following a chemical oxide removal process that can include a dry etching process or a wet etching process. The chemical oxide removal process removes the native oxide layer 106 from the Si layer 104 and the $SiO_x$ layer 102 and terminates the $SiO_x$ layer 102 with hydroxyl groups (—OH) 108. The Si layer 104 may be terminated with Si—H groups (not shown) by the chemical oxide removal process.

The dry etching process may be carried out in a processing system containing a COR module for chemically altering exposed surface layers on the substrate, a post heat treatment (PHT) module for thermally treating the chemically altered surface layers on the substrate, and an isolation assembly coupled between the PHT module and the COR module. In one example, the substrate may be exposed to a process gas containing HF and $NH_3$ in the COR module where the processing pressure can range from about 1 mTorr to about 100 mTorr and can, for example, range from about 2 mTorr to about 25 mTorr. The process gas flow rates can range from about 1 to about 200 sccm for each species and can, for example, range from about 10 sccm to about 100 sccm. Additionally, the COR module can be heated to a temperature ranging from 30° C. to 100° C. and, for example, the temperature can be about 40° C. Additionally, a gas distribution system for delivering the process gas to the COR module can be heated to a temperature ranging from about 40° to about 100° C. and, for example, the temperature can be about 50° C. The substrate can be maintained at a temperature ranging from about 10° C. to about 50° and, for example, the substrate temperature can be about 20° C.

In addition, in the PHT module, the thermal treatment chamber can be heated to a temperature ranging from about 50° C. to about 100° C. and, for example, the temperature can be about 80° C. In one example, the substrate can be heated to a temperature in excess of about 100° C. Alternatively, the substrate can be heated in a range from about 100° C. to about 200° C., and, for example, the temperature can be about 135° C.

In another example, a mixture of ozone and $H_2O$ vapor may be used in the dry etching process. In still another example, peroxide vapor may be used.

According to other embodiments, the chemical oxide removal can include a wet etching process. The wet etching process can, for example, utilize industry standard SC1 and SC2 solutions.

Following the chemical oxide removal process, the substrate may be subjected to a surface modification process that can include low-k restoration (LKR) or self-assembled monolayers (SAM). The surface modification process can include exposing the substrate in FIG. 1B to a process gas containing a hydrophilic functional group. In one example, the process gas can include trimethylsilane dimethylamine (TMSDMA). The process gas reacts selectively with the —OH groups 108 on the $SiO_x$ layer 102 by substituting the —OH groups 108 with the hydrophobic functional group (—$SiMe_3$) 110. This substitution improves subsequent selective deposition on the first surface 103 relative to on the hydrophobic modified second surface 107 which has a long incubation time. The hydrophobic modified second surface 107 contains few or no adsorption sites for metal-containing precursors and, therefore, an exposure to a metal-containing precursor results in a long incubation time and delayed metal-containing deposition on the hydrophobic modified second surface 107 relative to on the first surface 103. This enables selective formation of a metal-containing layer on the first surface 103 with little or no deposition on the hydrophobic modified second surface 107.

In some examples, the process gas containing a hydrophilic functional group can include a silicon-containing gas, including an alkyl silane, an alkoxysilane, an alkyl alkoxysilane, an alkyl siloxane, an alkoxysiloxane, an alkyl alkoxysiloxane, an aryl silane, an acyl silane, an aryl siloxane, an acyl siloxane, a silazane, or any combination thereof. According to some embodiments, the process gas may be selected from dimethylsilane dimethylamine (DMSDMA), trimethylsilane dimethylamine (TMSDMA), bis(dimethylamino) dimethylsilane (BDMADMS), and other alkyl amine silanes. According to other embodiments, the process gas may be selected from N,O-bistrimethylsilyltrifluoroacetamide (BSTFA) and trimethylsilyl-pyrrole (TMS-pyrrole).

According to some embodiments of the invention, the process gas may be selected from silazane compounds. Silazanes are saturated silicon-nitrogen hydrides. They are analogous in structure to siloxanes with —NH— replacing —O—. An organic silazane precursor can further contain at least one alkyl group bonded to the Si atom(s). The alkyl group can, for example, be a methyl group, an ethyl group, a propyl group, or a butyl group, or combinations thereof. Furthermore, the alkyl group can be a cyclic hydrocarbon group such as a phenyl group. In addition, the alkyl group can be a vinyl group. Disilazanes are compounds having from 1 to 6 methyl groups attached to the silicon atoms or having 1 to 6 ethyl groups attached the silicon atoms, or a disilazane molecule having a combination of methyl and ethyl groups attached to the silicon atoms.

The structure of hexamethyldisilazane (HMDS) is shown below.

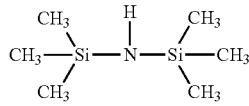

HMDS contains a Si—N—Si structural unit and three methyl groups bonded to each Si atom. HMDS is a commercially available silicon compound with a vapor pressure of about 20 Torr at 20° C.

Examples of organic silazane compounds are shown in TABLE 1.

TABLE 1

| | |
|---|---|
| Triethylsilazane | $SiC_6H_{17}N$ |
| Tripropylsilazane | $SiC_9H_{23}N$ |
| Triphenylsilazane | $SiC_{18}H_{17}N$ |
| Tetramethyldisilazane | $Si_2C_4H_{15}N$ |
| Hexamethyldisilazane | $Si_2C_6H_{19}N$ |
| Hexaethyldisilazane | $Si_2C_{12}H_{31}N$ |
| Hexaphenyldisilazane | $Si_2C_{36}H_{31}N$ |
| Heptamethyldisilazane | $Si_2C_7H_{21}N$ |
| Dipropyl-tetramethyldisilazane | $Si_2C_{10}H_{27}N$ |
| Di-n-Butyl-tetramethyldisilazane | $Si_2C_{12}H_{31}N$ |
| Di-n-Octyl-tetramethyldisilazane | $Si_2C_{20}H_{47}N$ |
| Triethyl-trimethylcyclotrisilazane | $Si_2C_9H_{27}N_3$ |
| Hexamethylcyclotrisilazane | $Si_3C_6H_{21}N_3$ |
| Hexaethylcyclotrisilazane | $Si_3C_{12}H_{33}N_3$ |
| Hexaphenylcyclotrisilazane | $Si_3C_{36}H_{33}N_3$ |
| Octamethylcyclotetrasilazane | $Si_4C_8H_{28}N_4$ |
| Octaethylcyclotetrasilazane | $Si_4C_{16}H_{44}N_4$ |

TABLE 1-continued

| | |
|---|---|
| Tetraethyl-tetramethylcyclotetrasilazane | $Si_4C_{12}H_{36}N_4$ |
| Cyanopropylmethylsilazane | $SiC_5H_{10}N_2$ |
| Tetraphenyldimethyldisilazane | $Si_2C_{26}H_{27}N$ |
| Diphenyl-tetramethyldisilazane | $Si_2C_{16}H_{23}N$ |
| Trivinyl-trimethylcyclotrisilazane | $Si_3C_9H_{21}N_3$ |
| Tetravinyl-tetramethylcyclotetrasilazane | $Si_4C_{12}H_{28}N_4$ |
| Divinyl-tetramethyldisilazane | $Si_2C_8H_{19}N$ |

Figure 1C:
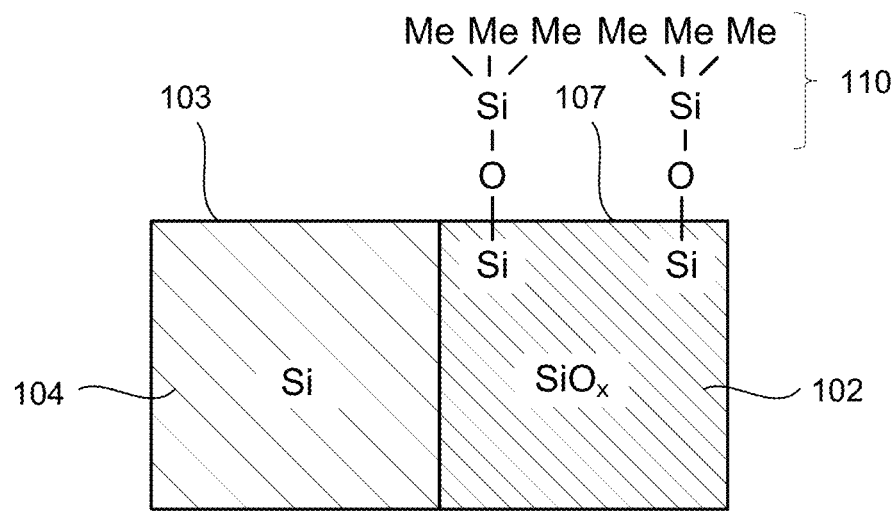
Figure 1D:
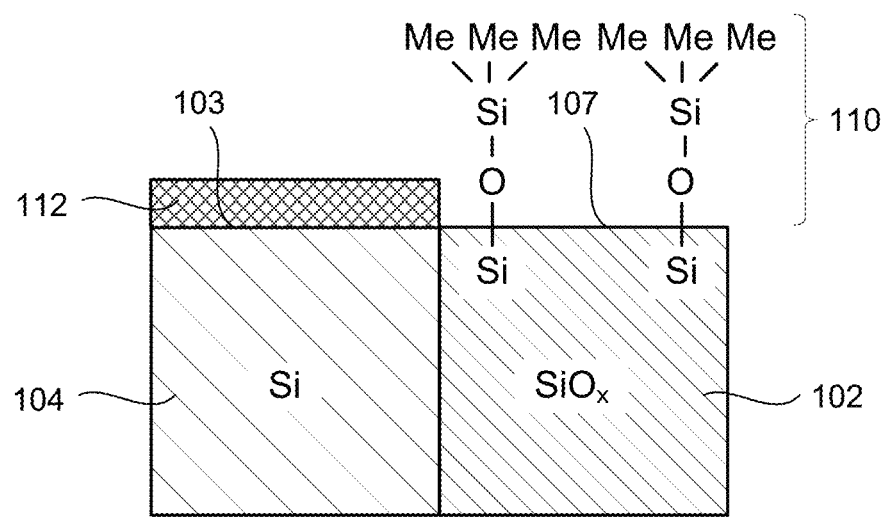

Following the surface modification process, the substrate in FIG. 1C may be exposed to a deposition gas to selectively deposit a metal-containing layer 112 on the first surface 103 but not on the modified second surface 107. According to some embodiments, the metal-containing layer 112 can contain a metal layer or a metal-compound layer including Ta, TaN, Ti, TiN, W, TW, Ru, Co, Mo, W, Pt, Ir, Rh, or Re, or a combination thereof. In one example, the deposition gas can contain metal-containing precursor vapor. The deposition gas can further contain a carrier gas (e.g., an inert gas), a reducing gas, or both a carrier gas and a reducing gas.

The metal-containing precursor vapor may contain a wide variety of Ta—, Ti—, or W-containing precursors, Examples of Ta-containing precursors containing "Ta—N" intra-molecular bonds include $Ta(NEt_2)_5$ (PDEAT), $Ta(NMe_2)_5$ (PDMAT), $Ta(NEtMe)_5$ (PEMAT), $Ta(NMe_2)_3(NCMe_2Et)$ (TAIMATA), $(tBuN)Ta(NMe_2)_3$ (TBTDMT), $(tBuN)Ta(NEt_2)_3$ (TBTDET), $(tBuN)Ta(NEtMe)_3$ (TBTEMT), and $(iPrN)Ta(NEt_2)_3$ (IPTDET). Other examples of Ta-containing precursors contain "Ta—C" intra-molecular bonds, for example $Ta(\eta^5-C_5H_5)_2H_3$, $Ta(CH_2)(CH_3)(\eta^5-C_5H_5)_2$, $Ta(\eta^3-C_3H_5)(\eta^5-C_5H_5)_2$, $Ta(CH_3)_3(\eta^5-C_5H_5)_2$, $Ta(CH_3)_4(\eta^5-C_5(CH_3)_5)$, or $Ta(\eta^5-C_5(CH_3)_5)_2H_3$. Other Ta-containing precursors contain "Ta—O" intra-molecular bonds, for example $Ta_2(OEt)_{10}$ and $(Me_2NCH_2CH_2O)Ta(OEt)_4$. $TaCl_5$ and $TaF_5$ are examples of tantalum halide precursors containing "Ta-halogen" bonds.

Representative examples of Ti-containing precursors having "Ti—N" intra-molecular bonds include $Ti(NEt_2)_4$ (TDEAT), $Ti(NMeEt)_4$ (TEMAT), $Ti(NMe_2)_4$ (TDMAT). Representative examples of Ti-containing precursors containing "Ti—C" intra-molecular bonds include $Ti(COCH_3)$ $(\eta^5-C_5H_5)_2Cl$, $Ti(\eta^5-C_5H_5)Cl_2$, $Ti(\eta^5-C_5H_5)Cl_3$, $Ti(\eta^5-C_5H_5)_2Cl_2$, $Ti(\eta^5-C_5(CH_3)_5)Cl_3$, $Ti(CH_3)(\eta^5-C_5H_5)_2Cl$, $Ti(\eta^5-C_9H_7)_2Cl_2$, $Ti(\eta^5-C_5(CH_3)_5)_2Cl$, $Ti((\eta^5-C_5(CH_3)_5)_2Cl_2$, $Ti(\eta^5-C_5H_5)_2(\eta—Cl)_2$, $Ti(\eta^5-C_5H_5)_2(CO)_2$, $Ti(CH_3)_3(\eta^5-C_5H_5)$, $Ti(CH_3)_2(\eta^5-C_5H_5)_2$, $Ti(CH_3)_4$, $Ti(\eta^5-C_5H_5)(\eta^7-C_7H_7)$, $Ti(\eta^5-C_5H_5)(\eta^8-C_8H_8)$, $Ti(C_5H_5)_2(\eta^5-C_5H_5)_2$, $Ti((C_5H_5)_2)_2(\eta—H)_2$, $Ti(\eta^5-C_5(CH_3)_5)_2$, $Ti(\eta^5-C_5(CH_3)_5)_2$ $(H)_2$, and $Ti(CH_3)_2(\eta^5-C_5(CH_3)_5)_2$. $TiCl_4$ is an example of a titanium halide precursor containing a "Ti-halogen" bond.

Representative examples of tungsten-containing (W-containing) precursors include $W(CO)_6$, which contains a "W—C" intra-molecular bond, and $WF_6$, which contains a "W-halogen" intra-molecular bond.

The metal-containing precursor vapor can contain a metal-containing precursor that may be selected from ruthenium (Ru)-containing precursors, cobalt (Co)-containing precursors, molybdenum (Mo)-containing precursors, tungsten (W)-containing precursors, platinum (Pt)-containing precursors, iridium (Ir)-containing precursors, rhodium (Rh)-containing precursors, and rhenium (Re)-containing precursors. Exemplary Ru-containing precursors include $Ru_3(CO)_{12}$, (2,4-dimethylpentadienyl) (ethylcyclopentadienyl) ruthenium (Ru(DMPD)(EtCp)), bis(2,4-dimethylpentadienyl) ruthenium (Ru(DMPD)$_2$), 4-dimethylpentadienyl) (methylcyclopentadienyl) ruthenium (Ru(DMPD)(MeCp)), or bis(ethylcyclopentadienyl) ruthenium (Ru(EtCp)$_2$).

Exemplary Co precursors include $Co_2(CO)_8$, $Co_4(CO)_{12}$, $CoCp(CO)_2$, $Co(CO)_3(NO)$, $Co_2(CO)_6(HCC^tBu)$, $Co(acac)_2$, $Co(Cp)_2$, $Co(Me_5Cp)_2$), $Co(EtCp)_2$, cobalt(II) hexafluoroacetylacetonate hydrate, cobalt tris(2,2,6,6-tetramethyl-3,5-heptanedionate), cobalt(III) acetylacetonate, bis(N,N'-diisopropylacetamidinato) cobalt, and tricarbonyl allyl cobalt. One exemplary Mo precursor is $Mo(CO)_6$. Exemplary W precursors include $W(CO)_6$ and tungsten halides ($WX_6$, where X is a halogen). Exemplary Pt precursors include $Pt(CO)_2Cl_2$, $Pt(acac)_2$, $Me_2PtC_5H_5$, $Pt(PF_3)_4$, and $MeCpPtMe_3$. Exemplary Ir precursors include $Ir_4(CO)_{12}$, $Ir(allyl)_3$, (methylcyclopentadienyl)(1,5-cyclooctadiene) iridium(I), $(C_6H_7)(C_8H_{12})Ir$, and $IrCl_3$. Exemplary Rh precursors include $Rh(acac)(CO)_2$, $(\eta^5\text{-}C_5H_5)Rh(H_2C=CH_2)_2$, $(\eta^5\text{-}C_5H_5)Rh(CO)_2$, and $RhCl_3$. One exemplary Re precursor is $Re_2(CO)_{10}$. It will be appreciated by those skilled in the art that a number of other metal-containing precursors may be used in embodiments of the present invention.

Figure 2A:
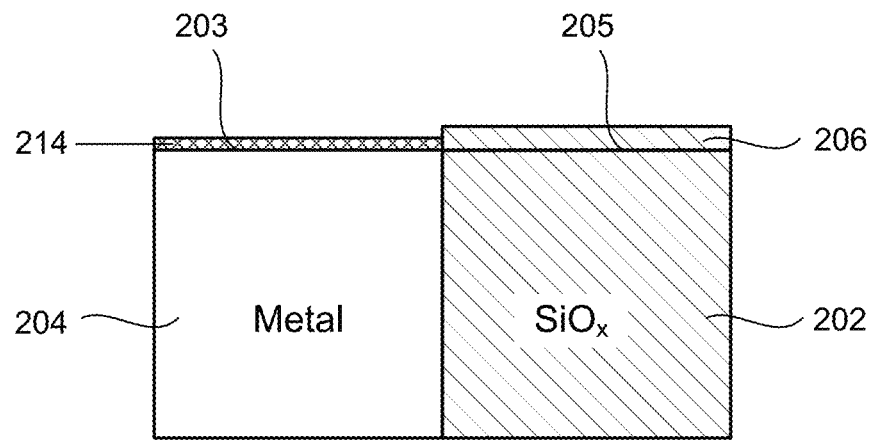
FIGS. 2A-2D show schematic cross-sectional views of a method for processing a substrate according to an embodiment of the invention.

FIGS. 2A-2D show schematic cross-sectional views of a method for processing a substrate according to an embodiment of the invention. FIG. 2A shows a substrate containing an initial metal-containing layer 204 having a first surface 203 and a $SiO_x$ layer 202 having a second surface 205. The substrate further contains a native oxide layer 206 on the $SiO_x$ layer 202 and an oxidized metal-containing layer 214 on the initial metal-containing layer 204. The native oxide layer 106 and the oxidized metal-containing layer 214 may form by atmospheric exposure that oxidizes the substrate. Alternatively, the native oxide layer 206 and the oxidized metal-containing layer 214 may include a chemical oxide layer that is deposited on the substrate. According to other embodiments, the $SiO_x$ layer 202 may further include or be replaced by one or more of SiN, SiOH, SiCOH, a high-k material, and a low-k material. Examples of the initial metal-containing layer 204 include metal layers and metal-containing compounds including Cu, Al, Ta, TaN, Ti, TiN, W, TW, Ru, Co, Mo, W, Pt, Ir, Rh, or Re, or a combination thereof.

Figure 2B:
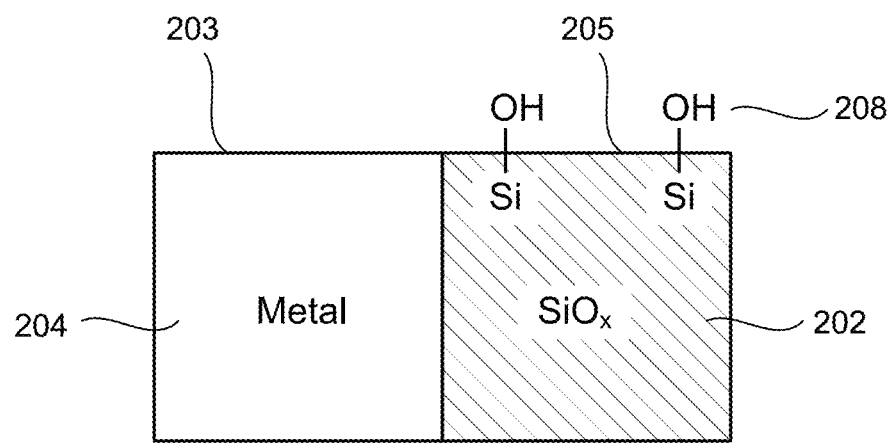

FIG. 2B shows the substrate following a chemical oxide removal process that can include a dry etching process or a wet etching process. The chemical oxide removal process removes the native oxide layer 206 from the $SiO_x$ layer 202 and terminates the $SiO_x$ layer 202 with hydroxyl groups (—OH) 208. The oxidized metal-containing layer 214 on the metal-containing layer 204 may also be removed by the chemical oxide removal process.

Following the chemical oxide removal process, the substrate may be subjected to a surface modification process that can include low-k restoration (LKR) or self-assembled monolayers (SAM). The surface modification process can include exposing the substrate in FIG. 2B to a process gas containing a hydrophilic functional group described above in reference to FIG. 1C. The process gas reacts selectively with the —OH groups 208 on the $SiO_x$ layer 202 by substituting the —OH groups 108 with the hydrophobic functional group (—SiMe₃) 210. The resulting substrate is shown in FIG. 2C.

Figure 2C:
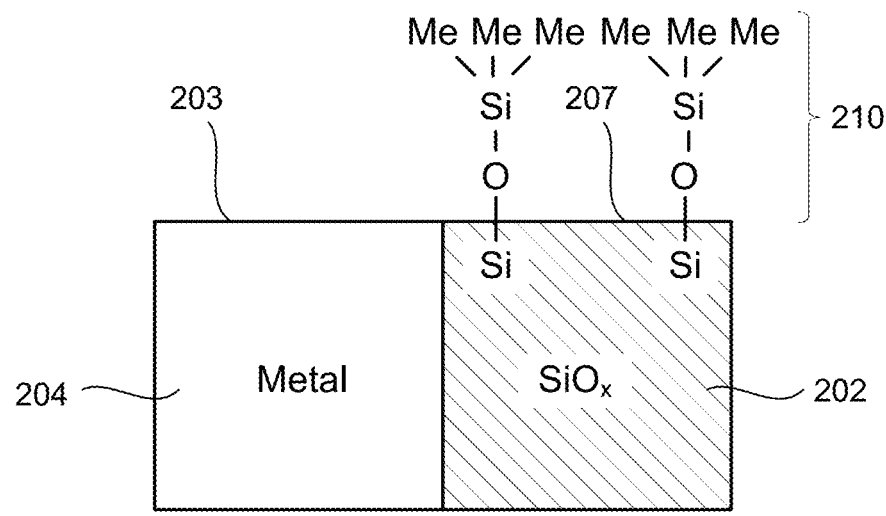
Figure 2D:
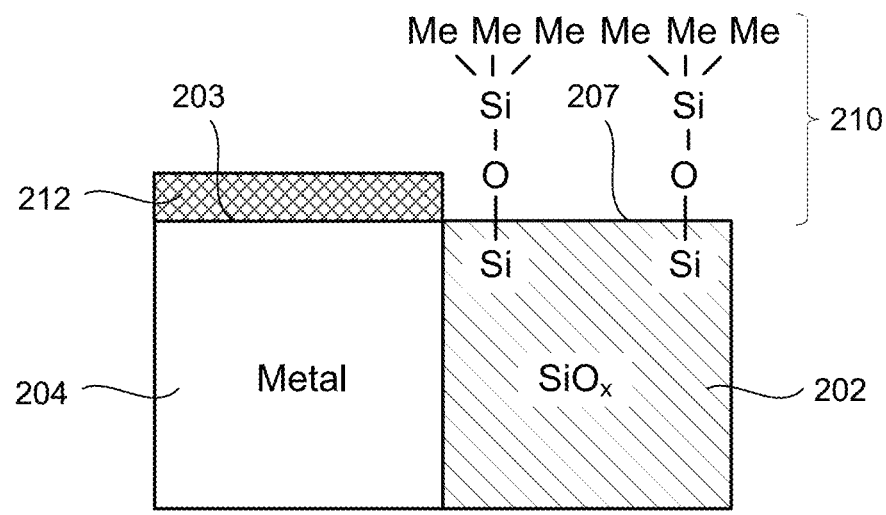

Thereafter, the substrate in FIG. 2C may be exposed to a deposition gas to selectively deposit a metal-containing layer 212 on the first surface 203 but not on the modified second surface 207. According to some embodiments, the metal-containing layer can include a metal layer or a metal-compound layer containing Ta, TaN, Ti, TiN, W, TW, Ru, Co, Mo, W, Pt, Ir, Rh, or Re, or a combination thereof.

Figure 3A:
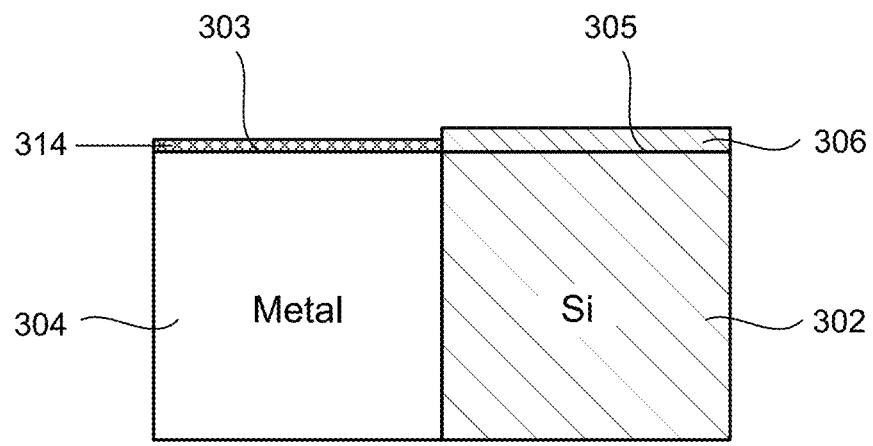
FIGS. 3A-3D show schematic cross-sectional views of a method of processing a substrate according to an embodiment of the invention.

FIGS. 3A-3D show schematic cross-sectional views of a method for processing a substrate according to an embodiment of the invention. FIG. 3A shows a substrate containing an initial metal-containing layer 304 having a first surface 303 and a Si layer 302 having a second surface 305. The substrate further contains a native oxide layer 306 on the Si layer 302 and an oxidized metal-containing layer 314 on the initial metal-containing layer 304. The native oxide layer 306 and the oxidized metal-containing layer 314 may form by atmospheric exposure that oxidizes the substrate. Alternatively, the native oxide layer 306 and the oxidized metal-containing layer 314 may include a chemical oxide layer that is deposited on the substrate. According to other embodiments, the Si layer 302 may be further include or be replaced by one or more of SiN, SiOH, SiCOH, a high-k material, and a low-k material. Examples of the initial metal-containing layer 304 include metal layers and metal-containing compounds such as Cu, Al, Ta, TaN, Ti, TiN, W, TW, Ru, Co, Mo, W, Pt, Ir, Rh, or Re, or a combination thereof.

Figure 3B:
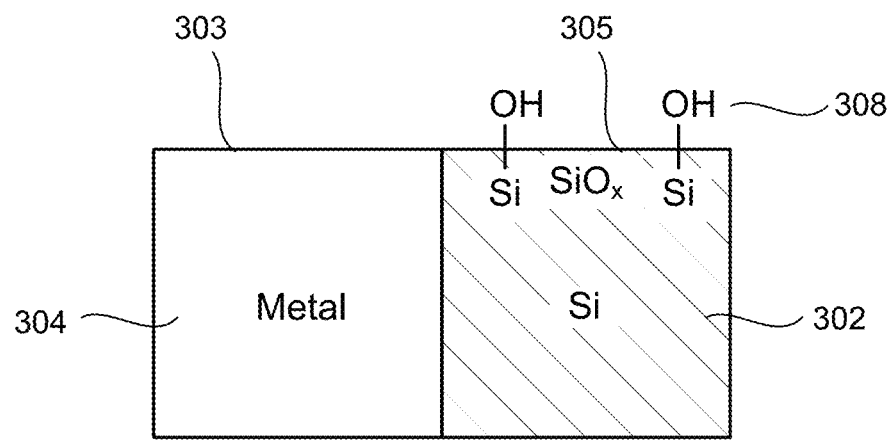

FIG. 3B shows the substrate following a chemical oxide removal process that can include a dry etching process or a wet etching process. The chemical oxide removal process partially removes the native oxide layer 306 from the Si layer 302 and terminates the remaining native oxide layer 306 with hydroxyl groups (—OH) 308. The oxidized metal-containing layer 314 on the initial metal-containing layer 304 may also be removed by the chemical oxide removal process.

Figure 3C:
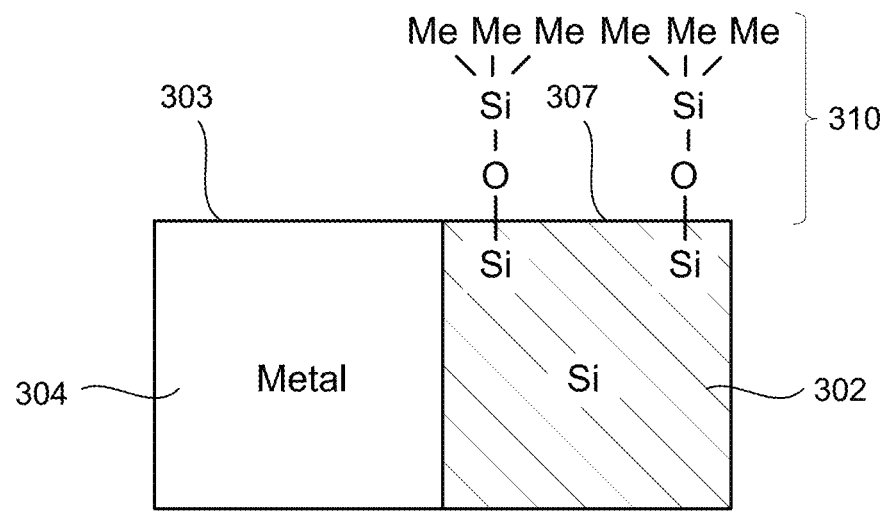

Following the chemical oxide removal process, the substrate may be subjected to a surface modification process that can include low-k restoration (LKR) or self-assembled monolayers (SAM). The surface modification process can include exposing the substrate in FIG. 3B to a process gas containing a hydrophilic functional group described above in reference to FIG. 1C. The process gas reacts selectively with the —OH groups 308 on the Si layer 302 by substituting the —OH groups 308 with the hydrophobic functional group (—SiMe₃) 310. The resulting substrate is shown in FIG. 3C.

Figure 3D:
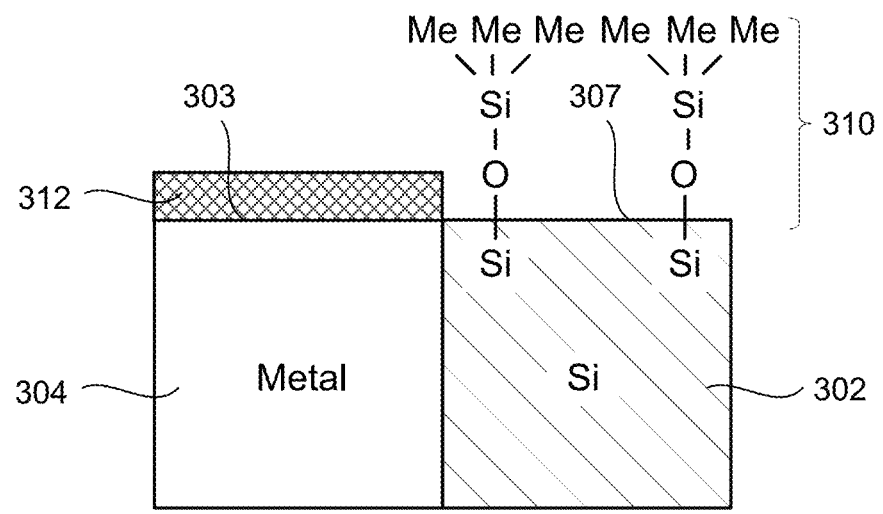

Thereafter, the substrate in FIG. 3D may be exposed to a deposition gas to selectively deposit a metal-containing layer 312 on the first surface 303 but not on the hydrophobic modified second surface 307. According to some embodiments, the metal-containing layer 312 can include a metal layer or a metal-containing compound layer including Ta, TaN, Ti, TiN, W, TW, Ru, Co, Mo, W, Pt, Ir, Rh, or Re, or a combination thereof.

Figure 4:
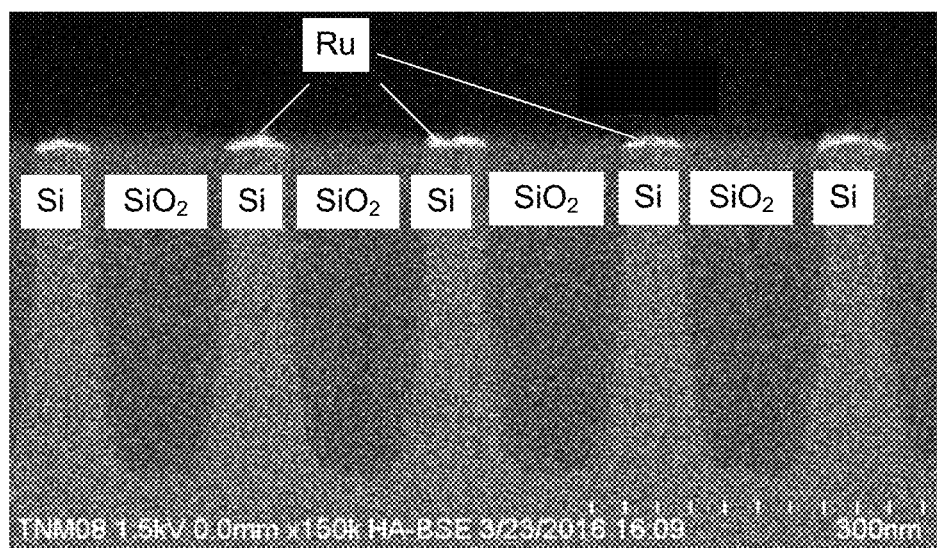
FIG. 4 show experimental results for selective deposition of Ru metal on Si according to an embodiment of the invention.

FIG. 4 show experimental results for selective deposition of Ru metal on Si according to an embodiment of the invention. The substrate contained raised Si features and a $SiO_2$ layer filling the recessed features between the raised Si features. The as-received substrate further contained a native oxide layer on the Si features and on the $SiO_2$ layer. The substrate was subjected to a chemical oxide removal, and thereafter to a surface modification process of the $SiO_2$ layer. Thereafter a Ru metal layer was selectively deposited on the Si layer by CVD using an exposure of $Ru_3(CO)_{12}$ and CO carrier gas. The cross-sectional backscattered electron (BSE) image shows the selective CVD Ru metal layer on the Si layer.

In other examples, a TaN layer and a TiN layer were selectively deposited on a Si according to an embodiment of the invention. The substrates contained raised Si features and a $SiO_2$ layer filling the recessed features between the raised Si features. The as-received substrates further contained a native oxide layer on the Si features and on the $SiO_2$ layer. The substrates were subjected to a chemical oxide removal, and thereafter to a surface modification process of the $SiO_2$ layer. Thereafter, a TaN layer was deposited using alternating gas exposures of TBTEMT and $NH_3$. Similarly, a TiN layer was deposited using alternating gas exposures of TEMAT and NH$_3$. Scanning electron microscopy, BSE, and transmission electron microscopy (TEM) was used to verify the selective TaN and TiN deposition on the raised Si features.

A method for selective deposition on different materials using a surface treatment has been disclosed in various embodiments. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method of processing a substrate, comprising:
   providing a substrate containing a first material layer having a first surface and a second material layer having a second surface, wherein the first material layer includes an initial metal-containing layer and the second material layer consists of silicon;
   performing a chemical oxide removal process that includes exposing the substrate to HF and NH$_3$ gases, wherein the chemical oxide removal process removes a first oxide layer from the first surface, partially removes a second oxide layer from the second surface, and terminates the second surface with hydroxyl groups;
   modifying the second surface by exposure to a process gas containing a hydrophobic functional group, the modifying substituting the hydroxyl groups on the second surface with the hydrophobic functional group; and
   selectively depositing a metal-containing layer on the first surface but not on the modified second surface by exposing the substrate to a deposition gas.

2. The method of claim 1, wherein the initial metal-containing layer includes a metal layer or a metal-compound layer.

3. The method of claim 2, wherein the metal layer and the metal-compound layer contain Cu, Al, Ta, TaN, Ti, TiN, W, TiW, Ru, Co, Mo, W, Pt, Ir, Rh, or Re, or a combination thereof.

4. The method of claim 1, wherein the process gas comprises a silicon-containing gas selected from an alkyl silane, an alkoxysilane, an alkyl alkoxysilane, an alkyl siloxane, an alkoxysiloxane, an alkyl alkoxysiloxane, an aryl silane, an acyl silane, an aryl siloxane, an acyl siloxane, a silazane, or any combination thereof.

5. The method of claim 1, wherein the metal layer and the metal-compound layer contain Al, Ta, TaN, Ti, TiN, W, TiW, Ru, Co, Mo, W, Pt, Ir, Rh, or Re, or a combination thereof.

* * * * *